(12) United States Patent
Wen (10) Patent No.: US 12,308,830 B2
(45) Date of Patent: *May 20, 2025

(54) POST-DRIVER WITH LOW VOLTAGE OPERATION AND ELECTROSTATIC DISCHARGE PROTECTION

(71) Applicant: Taiwan Semiconductor Manufacturing Company, Ltd., Hsinchu (TW)

(72) Inventor: Chin-Hua Wen, Toufen Township, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,024

(22) Filed: Nov. 22, 2023

(65) Prior Publication Data

US 2024/0088883 A1 Mar. 14, 2024

Related U.S. Application Data

(63) Continuation of application No. 17/828,581, filed on May 31, 2022, now Pat. No. 11,855,613.

(51) Int. Cl.
*H03K 19/0175* (2006.01)
*H03F 3/45* (2006.01)
(Continued)

(52) U.S. Cl.
CPC ......... *H03K 17/08* (2013.01); *H03F 3/45269* (2013.01); *H03K 19/017545* (2013.01); *H03K 19/018557* (2013.01); *H03K 5/24* (2013.01)

(58) Field of Classification Search
CPC ....... H03K 19/0175; H03K 19/017545; H03K 19/0185; H03K 19/018557; H03K 19/018564; H03K 19/018571; H03K 19/018587; H03K 19/2481; H03K 17/08; H03K 17/082; H03K 17/0822; H03K 5/22;
(Continued)

(56) References Cited

U.S. PATENT DOCUMENTS

| 6,573,746 B2 * | 6/2003 | Kim | G05F 1/46 |
| | | | 326/82 |
| 7,782,078 B2 * | 8/2010 | Koo | H03K 17/6871 |
| | | | 327/112 |

(Continued)

*Primary Examiner* — Long Nguyen
(74) *Attorney, Agent, or Firm* — Merchant & Gould P.C.

(57) ABSTRACT

A post-driver with low voltage operation and electrostatic discharge protection is provided. A post-driver structure includes a drive unit including a pull-up driver and a pull-down driver, a pad connected to an external resistance, and an output node connected between the pull-up driver and the pull-down driver. The output node is configured to connect to a comparator for impedance calibration of the drive unit. The post-driver structure also includes an operational amplifier connected to a first transistor and the pad in a closed loop configuration. The operational amplifier is further connected to a second transistor to form a current mirror circuit between the operational amplifier and the drive unit. The current mirror circuit replicates a voltage at the pad with a voltage at the output node for the impedance calibration.

20 Claims, 5 Drawing Sheets

(51) Int. Cl.
*H03K 17/08* (2006.01)
*H03K 19/0185* (2006.01)
*H03K 5/24* (2006.01)

(58) Field of Classification Search
CPC .. H03K 5/24; H03K 5/2472; G01R 19/16566; G01R 19/16571
See application file for complete search history.

(56) References Cited

U.S. PATENT DOCUMENTS

| | | | |
|---|---|---|---|
| 11,855,613 B2* | 12/2023 | Wen | H03K 19/0005 |
| 11,936,356 B2* | 3/2024 | Wen | G11C 29/50008 |
| 2002/0063575 A1 | 5/2002 | Kim et al. | |

* cited by examiner

POST-DRIVER WITH LOW VOLTAGE OPERATION AND ELECTROSTATIC DISCHARGE PROTECTION

PRIORITY CLAIM AND CROSS-REFERENCE

This application is a Continuation of U.S. patent application Ser. No. 17/828,581 filed May 31, 2022, and issued as U.S. Pat. No. 11,855,613 on Dec. 26, 2023, the disclosure of which is hereby incorporated herein by reference in its entirety.

BACKGROUND

Integrated circuits (ICs) are increasingly packaged in so-called 2.5D and 3D structures which integrate multiple dies in a single package to increase density and performance. Although the density of high-speed input/output (I/O) interfaces in such packaging improves performance, overheating can become a concern. One way to reduce heat is to use a low voltage post-driver. However, a post-driver structure capable of operating at low voltage typically has increased risk of an electrostatic discharge (ESD) event damaging components of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
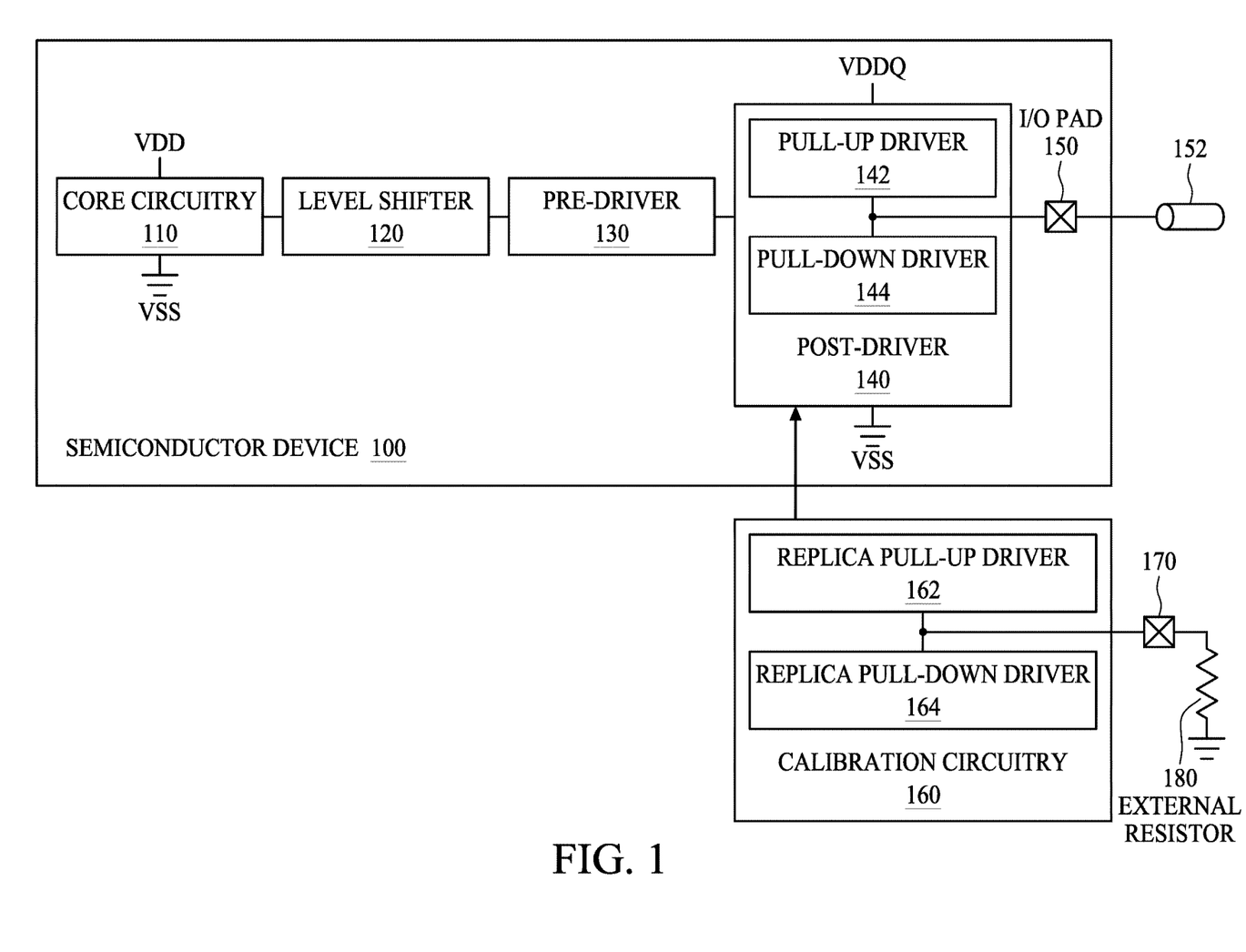
FIG. 1 is a block diagram of a semiconductor device in accordance with some embodiments.

FIG. 1 is a block diagram of a semiconductor device 100 in accordance with some embodiments. Semiconductor device 100 includes core circuitry 110, level shifter 120, pre-driver 130, post-driver 140, and Input/Output (I/O) pad 150. Semiconductor device 100 may comprise an integrated circuit (IC) or chip in which core circuitry 110 generates and distributes data to one or more high-speed interfaces. For example, semiconductor device 110 may comprise a processor or memory controller having core circuitry 100 with high-speed logic circuitry or may comprise a memory device (e.g., dynamic random access memory (DRAM)) having core circuitry 110 made up of memory storage cells. In any case, each I/O interface may use post-driver 140 and I/O pad 150 to communicate with other ICs or devices via transmission medium 152 (e.g., a trace or bus).

Generally, core circuitry 110 operates in a first power domain between a power supply VDD and ground VSS, and post-driver 140 operates in a second power domain between a power supply VDDQ and ground VSS. Level shifter 120 and pre-driver 130 are configured to shift signals of core circuitry 110 from the first power domain to the second power domain for post-driver 140 to reliably transmit signals. However, if the characteristic package impedance of I/O pad 150 does not match the characteristic impedance of transmission medium 152, signal reflections tend to occur, degrading signal quality. Mismatched impedance sometimes occurs as a result of process, voltage, and temperature (PVT) variation.

Accordingly, semiconductor device 100 may include or otherwise make use of calibration circuitry 160 configured to adjust the impedance of post-driver 140 to compensate for PVT variation and improve signal quality. Calibration circuitry 160 includes replica pull-up driver 162 and replica pull-down driver 164 having a same configuration as pull-up driver 142 and pull-down driver 144 of post-driver 140. During calibration, the impedances of replica pull-up driver 162 and replica pull-down driver 164 are adjusted to be substantially equal to a resistance value of external resistor 180 connected between calibration pad 170 and ground. Since the configuration of calibration circuitry 160, calibration pad 170, and external resistor 160 emulates post-driver 140, I/O pad 150, and transmission medium 152, the determined calibrated values may be input to pull-up driver 142 and pull-down driver 144 to optimize signaling of post-driver 140. Moreover, as discussed in greater detail below, the configuration of post-driver 140 and calibration circuitry 180 is enhanced to enable low voltage operation while providing electrostatic discharge (ESD) protection.

Figure 2:
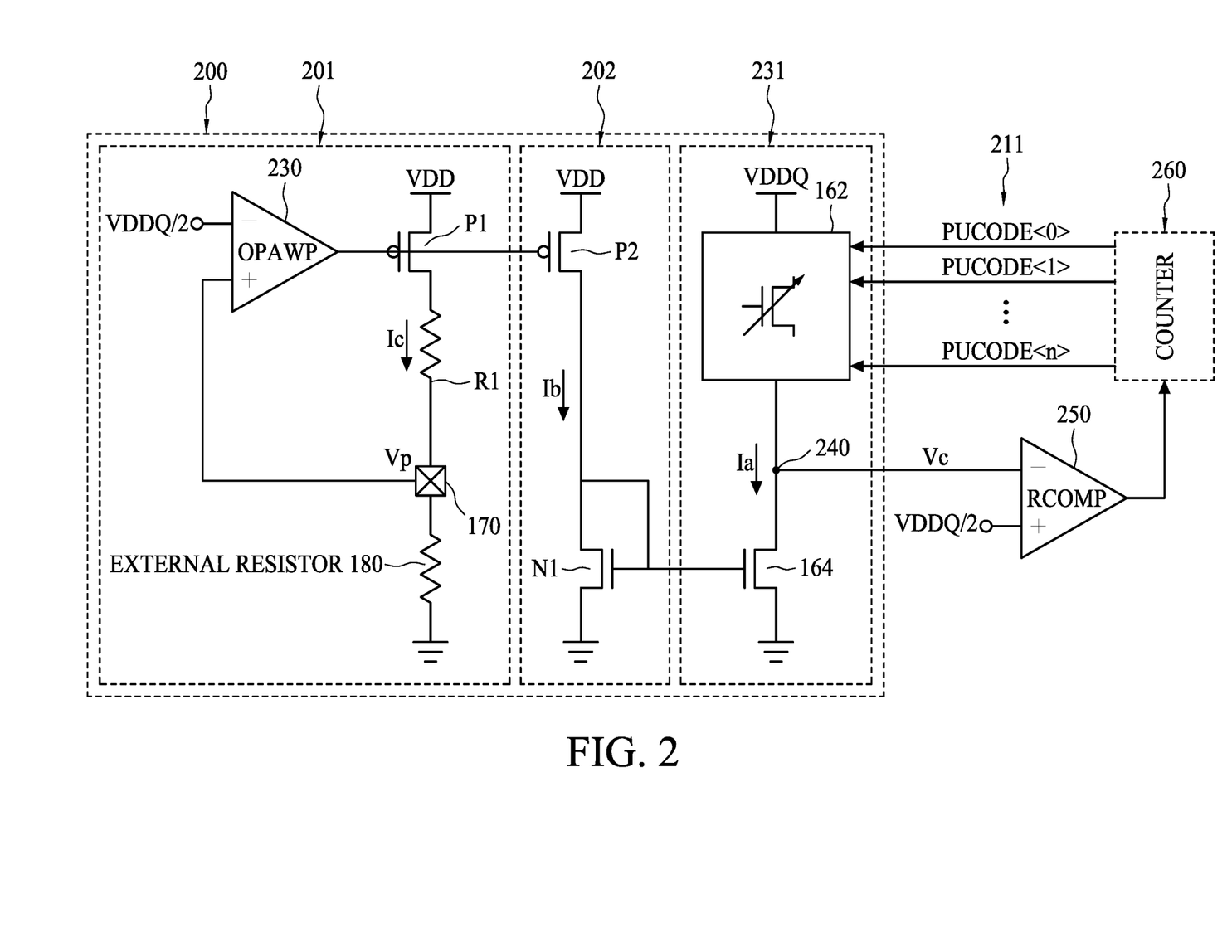
FIG. 2 is a diagram of a post-driver structure capable of low voltage operation and ESD protection in accordance with some embodiments.

FIG. 2 is a diagram of a post-driver structure 200 capable of low voltage operation and ESD protection in accordance with some embodiments. Post-driver structure 200 is shown and described with respect to an incorporation with calibration circuitry (e.g., calibration circuitry 160), though it will be appreciated the structure is also applicable to post-driver circuitry (e.g., post-driver 140). Post-driver structure 200 enables low voltage operation (e.g., approximately 0.3V), advantageously decreasing heat and power consumption when used in an actual post-driver (e.g., post-driver 140). Moreover, post-driver structure 200 is configured to calibrate the impedance of drive unit 231 against external resistor 180 while protecting drive unit 231 from potential ESD damage since calibration pad 170 (or I/O pad 150) does not connect directly to drive unit 231.

In previous post-driver structures, the calibration circuitry calibrates an output impedance of a post-driver against an external resistor, but there is a direct current path between the post-driver (or drive unit) and the pad. A direct current path means that pad 150/170 may potentially render the drive unit susceptible to damage caused by an ESD event. For example, if the drive unit stores static charge, an accidental grounding of pad 150/170 during a function test or in the field can cause a fast-rising, high current stress that damages the transistors of the drive unit. To solve this problem, some post-drivers incorporate resistors to protect the transistors from ESD damage. However, although the resistor protects against ESD damage, it prevents the post-driver from being able to operate at a low voltage (e.g., approximately 0.3V) which can be useful for reducing heat/power consumption of a semiconductor device.

Drive unit 231 includes replica pull-up driver 162 and replica pull-down driver 164 connected in series in the second power domain (e.g., between VDDQ and ground). Drive unit 231 also includes output node 240 between replica pull-up driver 162 and replica pull-down driver 164 that connects to a first input terminal of comparator 250. A second input of comparator 250 receives a reference voltage (e.g., VDDQ/2). Counter 260 receives the output of comparator 250 and increments an impedance control signal 211 provided to replica pull-up driver 162 for pull-up calibration. Although post-driver structure 200 is shown and described with respect to a pull-up calibration of replica pull-up driver 162 of drive unit 231, it will be appreciated that similar calibration may apply to replica pull-down driver 164.

Post-driver structure 200 also includes one or more current mirror circuits 201-202 disposed between calibration pad 170 and drive unit 231. First current mirror circuit 201 includes operational amplifier (op amp) 230 and first PMOS transistor P1 arranged in a closed loop. A first input (i.e., inverting input) of op amp 230 receives a reference voltage (e.g., VDDQ/2). This reference voltage may be the same or based on the reference voltage received at input of comparator 250. An output of op amp 230 is coupled to a gate of P1. A first source/drain (S/D) terminal of P1 is connected to the power supply of the first domain (i.e., VDD), and a second S/D terminal of P1 is connected to calibration pad 170 through a resistor R1. Calibration pad 170 is also connected to the second input (e.g., non-inverting input) of op amp 230 through a resistor R2 to form the closed loop.

Op amp 230 outputs a gate voltage to the gate of P1 based on a value of the reference voltage. Due to the positive feedback loop, if voltage Vp at calibration pad 170 is lower than the reference voltage, op amp 230 output saturates toward the negative supply rail (e.g., ground), turning on P1 to connect the power supply VDD to calibration pad 170. Otherwise, if voltage Vp at calibration pad 170 is higher than the reference voltage, op amp 230 output saturates toward the positive supply rail, turning off P1 to decrease voltage Vp. Post-driver structure 200 thus enables low voltage operation (e.g., approximately 0.3V), advantageously decreasing heat and power consumption when used in an actual post-driver (e.g., post-driver 140).

Additionally, the output of op amp 230 is connected to the gate of a second PMOS transistor P2. A first source/drain (S/D) terminal of P2 is connected to the power supply of the first domain (i.e., VDD), and a second S/D terminal of P2 is connected to a diode-connected first NMOS transistor N1. In particular, N1 includes a first S/D terminal connected to P2, a second S/D terminal connected to ground, and a gate which is connected to its first S/D terminal and also connected to drive unit 231. In one embodiment, the gate of N1 is connected to gate(s) of pull-down transistor(s) (e.g., NMOS transistors) of replica pull-down driver 164.

Accordingly, op amp 230, P1, P2, and/or N1 collectively form one or more current mirror circuits 201-202 to duplicate the current (e.g., currents Ia, Ib, and Ic shown in FIG. 2) and voltage at left side and right side of post-driver structure 200. The calibration voltage Vc received at comparator 250 is thus equal or proximate to the voltage Vp at calibration pad 170. Post-driver structure 200 is thus advantageously enabled to calibrate the impedance of drive unit 231 against external resistor 180 while protecting drive unit 231 from potential ESD damage since calibration pad 170 (or I/O pad 150) does not connect directly to drive unit 231.

Figure 3:
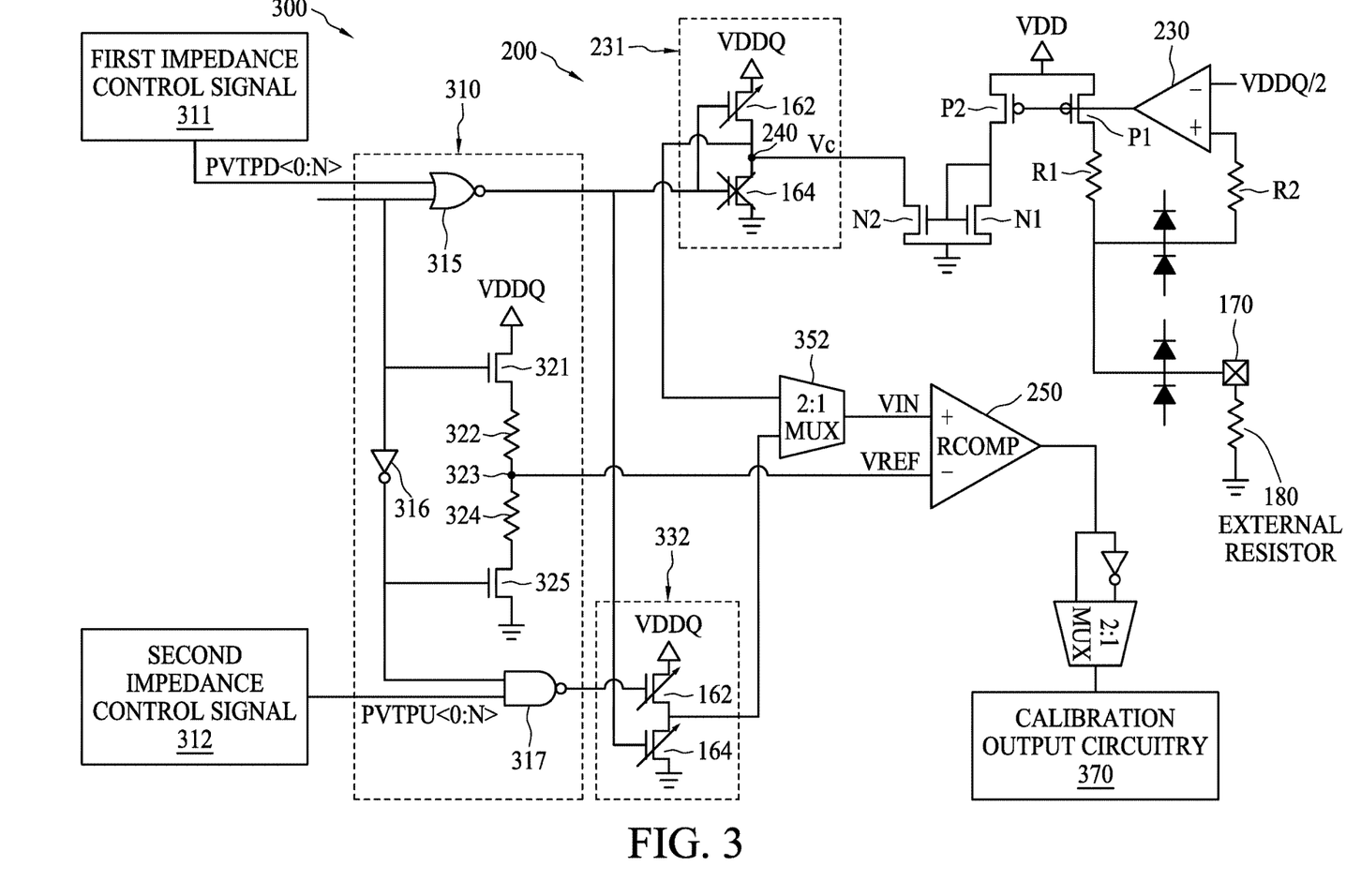
FIG. 3 is a diagram of calibration circuitry having the post-driver structure in accordance with some embodiments.

FIG. 3 is a diagram of calibration circuitry 300 having the post-driver structure 200 in accordance with some embodiments. In particular, FIG. 3 shows an embodiment in which pull-up calibration is performed first, and pull-down calibration is preformed last. During pull-up calibration, codes from a first impedance control signal 311 and second impedance control signal 312 are generated and input to drive unit 231 and a second drive unit 332 via control logic 310. With replica pull-down driver 164 of drive unit 231 turned off, the pull-up codes determine the termination resistance for impedance matching. In particular, post-drive structure 200 enables impedance matching against external resistor 180 without directly connecting calibration pad 170 to drive unit 231. In this embodiment, the gate of N1 is connected to the gate of second NMOS transistor N2. In particular, N2 includes a first S/D terminal connected to ground, and a second S/D terminal connected to output node 240 which provides calibration voltage Vc as input (e.g., Vin) to comparator 250 for calibration.

Calibration circuitry 300 includes control logic 310 for controlling drive unit 231 and a second drive unit 332 with first impedance control signal 311 (e.g., PVTPD<0:N>) and second impedance control signal 312 (e.g., PVTPU<0:N>). In particular, control logic 310 includes a NOR gate 315 having a first terminal to receive first impedance control signal 311 and a second terminal connected to a first terminal of a NAND gate 317 via an inverter 316. The second terminal of NAND gate 317 receives second impedance control signal 312. An output of NAND gate 317 connects to a gate of replica pull-up driver 162 of second drive unit 332. An output of NOR gate 315 is connected to gates of replica pull-up driver 162 and replica pull-down driver 164 of drive unit 231, and is also connected to a gate replica pull-down driver 164 of second drive unit 332.

Control logic 310 also provides a reference voltage Vref to a first input of a comparator 250. The reference voltage Vref may be provided by a node 323 between a first resistor 322 and second resistor 324 of control logic 310. In particular, control logic 310 may include a first transistor 321 (e.g., NMOS), first resistor 322, second resistor 324, and second transistor 325 (e.g., NMOS) connected in series in the second power domain (e.g., between VDDQ and ground). A gate of first transistor 321 connects to the second terminal of NOR gate 315, and a gate of second transistor 325 connects to the first terminal of NAND gate 317.

A second input of comparator 250 receives input voltage Vin that is output by either drive unit 231 or second drive unit 332 selected by selector 352 (e.g., 2:1 multiplexer). Drive unit 231 and second drive unit 332 each include replica pull-up driver 162 and replica pull-down driver 164. Generally, replica pull-up driver 162 includes a network of pull-up transistors that turn on/off according to bits of first impedance control signal 311 to adjust the total resistance value of replica pull-up driver 162. Replica pull-down driver 164 is similarly configured with respect to a network of pull-down transistors and second impedance control signal 312. In some embodiments, replica pull-up driver(s) 162 and replica pull-down driver(s) 164 each comprise an adjustable network of NMOS transistors.

For example, during pull-up calibration of drive unit 231, replica pull-up driver 162 is turned on and adjusted by sweeping first impedance control signal 311 while replica pull-down driver 164 is turned off (as shown in FIG. 3). The impedance adjustment of drive unit 231 causes corresponding adjustment of the voltage at output node 240 (e.g., Vc and/or Vin). When the voltage at output node 240 is low (i.e., Vin less than Vref), comparator 250 outputs a first signal (e.g., zero). As voltage at output node 240 is stepped up, it eventually crosses a threshold (i.e., Vin greater than Vref) at which point comparator 250 outputs a second signal (e.g., one), and the change of output signal indicates an impedance match with external resistor 180.

The change or switch in output of comparator 250 indicates that the calibration voltage Vc at output node 240 equals or is at least approximately equal to the reference voltage Vref (e.g., VDDQ/2). Counter 260 and/or calibration output circuitry 370 may store and/or provide the code or bits of first signal 211 which set the impedance of replica pull-up driver 162 to enable this switch at output of comparator 250. Accordingly, calibration output circuitry 370, which is connected to output of comparator 250, may detect/determine the circuit configuration and value of first impedance control signal 211 for setting the output impedance of the actual post-driver (e.g., post-driver 140 of FIG. 1).

Figure 4:
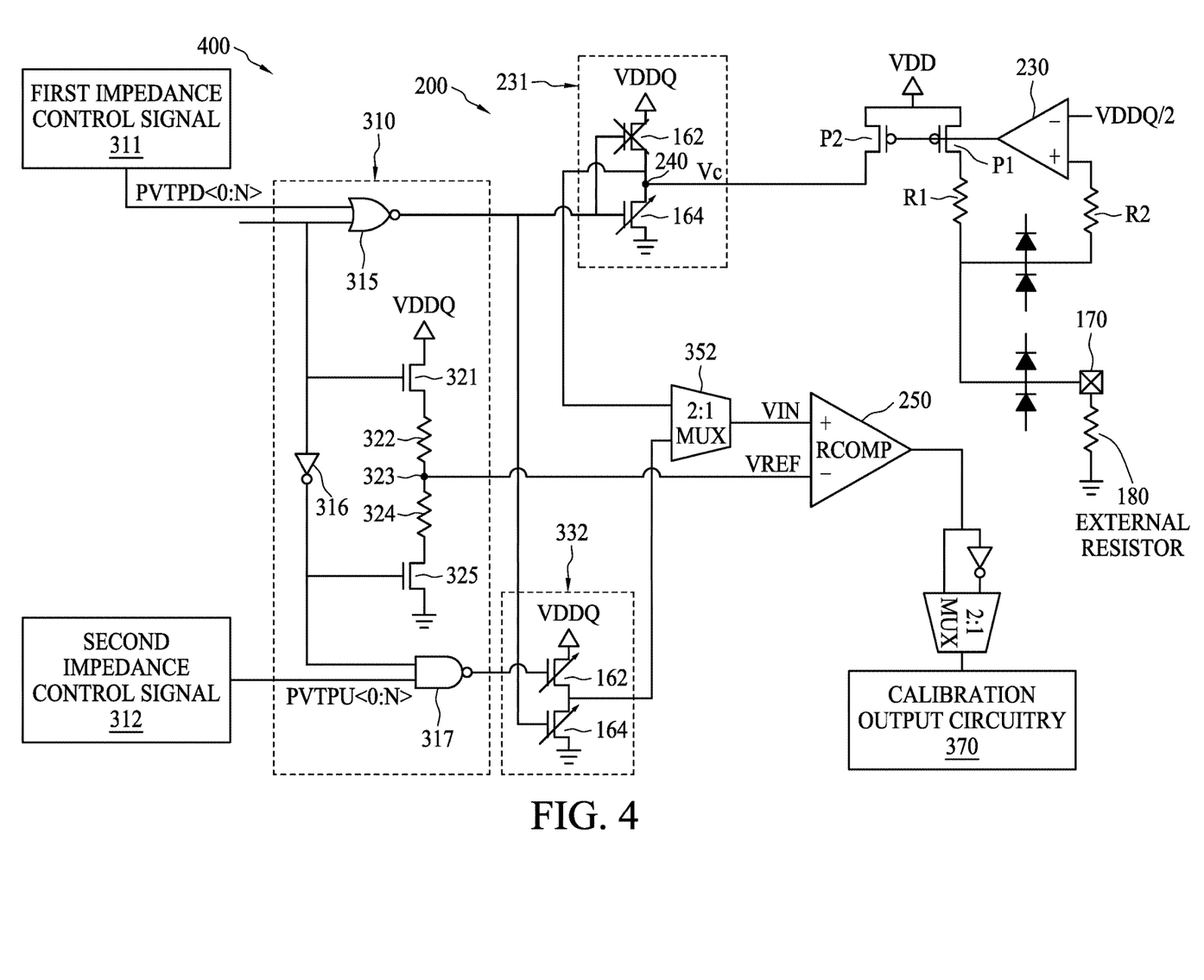
FIG. 4 is a diagram of calibration circuitry having the post-driver structure in accordance with another embodiment.

FIG. 4 is a diagram of calibration circuitry 400 having the post-driver structure 200 in accordance with another embodiment. In particular, FIG. 4 shows an embodiment in which pull-down calibration is performed first and pull-up calibration is preformed last. During pull-down calibration, codes from first impedance control signal 311 and second impedance control signal 312 are generated and input to drive unit 231 and second drive unit 332 via control logic 310. With replica pull-up driver 162 turned off, the pull-up codes determine the termination resistance for impedance matching. In particular, post-drive structure 200 enables impedance matching against external resistor 180 without directly connecting calibration pad 170 to drive unit 231. In this embodiment, the second S/D terminal of P2 is connected to output node 240 which provides calibration voltage Vc as input (e.g., Vin) to comparator 250 for calibration.

Figure 5:
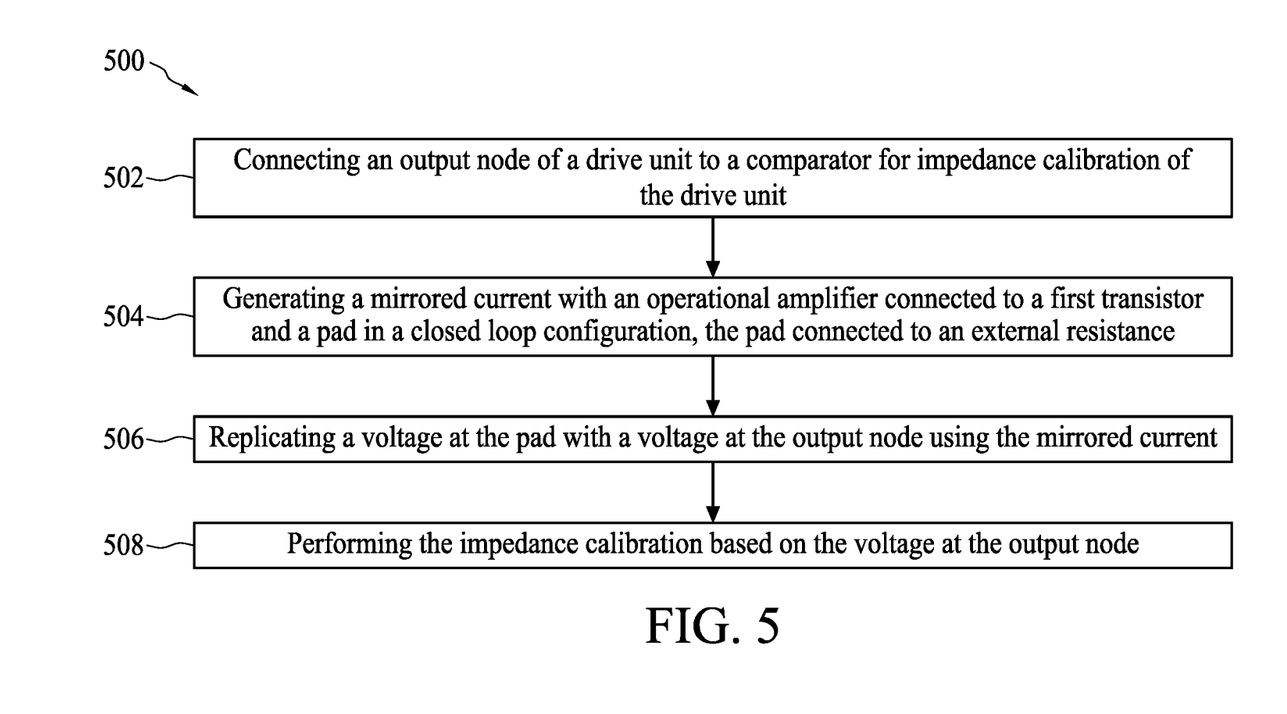
FIG. 5 illustrates an example method of calibrating a post-driver.

FIG. 5 illustrates an example method 500 of calibrating a post-driver. At operation 502, output node 240 of drive unit 231 is connected to comparator 250 for impedance calibration of drive unit 231. At operation 504, a mirrored current is generated with op amp 230 connected to P1 and pad 150/170 in a closed loop configuration, wherein pad 150/170 is connected to external resistance. At operation 506, a voltage at pad 150/170 is replicated with a voltage at output node 240 using the mirrored current. At operation 508, the impedance calibration is performed based on the voltage at output node 240.

Accordingly, the various embodiments disclosed herein provide a post-driver structure, comprising: a drive unit including a pull-up driver and a pull-down driver; a pad configured to connect to an external resistance; an output node connected between the pull-up driver and the pull-down driver, the output node configured to connect to a comparator for impedance calibration of the drive unit; and an operational amplifier connected to a first transistor and the pad in a closed loop configuration, the operational amplifier further connected to a second transistor to form a current mirror circuit between the operational amplifier and the drive unit, wherein the current mirror circuit replicates a voltage at the pad with a voltage at the output node for the impedance calibration.

Another embodiment is calibration circuitry for a post-driver, the calibration circuitry comprising: a drive unit; a comparator configured to receive an input voltage from the first drive unit, and to receive a reference voltage to compare with the input voltage for impedance calibration of the first drive unit; a pad connected to an external resistance; and a current mirror circuit including an operational amplifier connected to a first transistor and the pad in a closed loop configuration, wherein the current mirror circuit replicates a voltage at the pad with the input voltage for the impedance calibration.

Yet another embodiment is a method of calibrating a post-driver, comprising: connecting an output node of a drive unit to a comparator for impedance calibration of the drive unit; generating a mirrored current with an operational amplifier connected to a first transistor and a pad in a closed loop configuration, the pad connected to an external resistance; replicating a voltage at the pad with a voltage at the output node using the mirrored current; and performing the impedance calibration based on the voltage at the output node.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A post-driver structure, comprising:
    a drive unit comprising a replica pull-up driver and a replica pull-down driver;
    a pad configured to connect to an external resistor and a first node of the replica pull-up driver;
    a first multiplexer, wherein a first node of the replica pull-up driver is connected to a first input terminal of the first multiplexer, wherein a second node of the pull-down driver is connected to a second input terminal of the first multiplexer;
    a comparator, wherein an output terminal of the first multiplexer is connected to the comparator; and
    a second multiplexer, wherein a first input terminal of the second multiplexer is connected to an output terminal of the comparator, wherein a second input terminal of the second multiplexer is connected to the output terminal of the comparator through an inverter, and wherein an output terminal of the second multiplexer is connected to a calibration output circuit.

2. The post-driver structure of claim 1, wherein the drive unit is connected in a low voltage domain between a power supply VDDQ and the ground.

3. The post-driver structure of claim 1, wherein the power supply VDDQ is 0.3V.

4. The post driver of claim 1, further comprising:
an operational amplifier connected to a first transistor and the pad in a closed loop configuration, the operational amplifier further connected to a second transistor to form a current mirror circuit between the operational amplifier and the drive unit, wherein the current mirror circuit replicates a voltage at the pad with a voltage at the first node of the replica pull-up driver.

5. The post-driver structure of claim 4, further comprising a diode-connected transistor connected to the second transistor.

6. The post-driver structure of claim 5, wherein a gate of the diode-connected transistor is connected to the drive unit.

7. The post-driver structure of claim 5, wherein the first transistor and the second transistor comprise PMOS transistors, and wherein the diode-connected transistor comprises an NMOS transistor.

8. The post-driver structure of claim 4, wherein an output terminal of the operational amplifier is connected to gates of the first transistor and the second transistor.

9. The post-driver structure of claim 1, wherein:
the replica pull-up driver is configured to adjust a pull-up impedance; and
the replica pull-down driver is configured to adjust a pull-down impedance.

10. A calibration circuitry for a post-driver, the calibration circuitry comprising:
a replica pull-up driver;
a replica pull-down driver;
a pad connected to an external resistor and a first node of the replica pull-up driver;
a first multiplexer, wherein the first node of the replica pull-up driver is connected to a first input terminal of the first multiplexer, and wherein a second node of the pull-down driver is connected to a second input terminal of the first multiplexer;
a comparator, wherein an output terminal of the first multiplexer is connected to the comparator; and
a second multiplexer, wherein a first input terminal of the second multiplexer is connected to an output terminal of the comparator, wherein a second input terminal of the second multiplexer is connected to the output terminal of the comparator through an inverter, and wherein an output terminal of the second multiplexer is connected to a calibration output circuit.

11. The calibration circuitry of claim 10, wherein the comparator is configured to receive an input voltage from one of the replica pull-up driver and the replica pull-down driver.

12. The calibration circuitry of claim 11, wherein the replica pull-up driver and the replica pull-down driver are connected in a low voltage domain between a power supply VDDQ and ground.

13. The calibration circuitry of claim 12, wherein the power supply VDDQ is approximately 0.3V.

14. The calibration circuit of claim 10, further comprising:
an operational amplifier connected to a first transistor and the pad in a closed loop configuration, the operational amplifier further connected to a second transistor to form a current mirror circuit between the operational amplifier and the drive unit, wherein the current mirror circuit replicates a voltage at the pad with a voltage at the first node of the replica pull-up driver.

15. The calibration circuitry of claim 10, wherein the replica pull-up driver and the replica pull down driver each comprise an adjustable network of NMOS transistors.

16. A method of calibrating a post-driver, comprising:
replicating, through a replica pull-up driver, a first voltage at a pad connected to an external resistor at a first input terminal of a first multiplexer;
providing, through a replica pull-down driver, a second voltage at a second input terminal of the first multiplexer;
providing, by the first multiplexer, one of the first voltage and the second voltage to a first input terminal of a comparator;
providing a reference voltage to a second input terminal of the comparator;
providing, by the comparator, an output signal to a calibration circuit based on comparing the reference voltage with one of the first voltage and the second voltage; and
performing, by the calibration output circuitry, impedance calibration of the replica pull-up driver based on the output signal.

17. The method of claim 16, further comprising comparing, with the comparator, the first voltage at the pad with a reference voltage.

18. The method of claim 16, further comprising: selecting, by the first multiplexer, one of the first voltage and the second voltage to provide to the first input terminal of the comparator.

19. The method of claim 16, further comprising: performing, by the calibration output circuitry, impedance calibration of the pull-down driver based on the output signal.

20. The method of claim 16, further comprising: performing impedance calibration of the post driver based on the output signal.

* * * * *